US010510417B2

(12) United States Patent
Yamabe et al.

(10) Patent No.: US 10,510,417 B2
(45) Date of Patent: Dec. 17, 2019

(54) SEMICONDUCTOR MEMORY DEVICE AND MEMORY SYSTEM

(71) Applicant: Toshiba Memory Corporation, Minato-ku (JP)

(72) Inventors: Kazuharu Yamabe, Yokkaichi (JP); Tatsuo Izumi, Yokkaichi (JP)

(73) Assignee: Toshiba Memory Corporation, Minato-ku (JP)

( * ) Notice: Subject to any disclaimer, the term of this patent is extended or adjusted under 35 U.S.C. 154(b) by 0 days.

(21) Appl. No.: 16/101,904

(22) Filed: Aug. 13, 2018

(65) Prior Publication Data

US 2019/0287622 A1  Sep. 19, 2019

(30) Foreign Application Priority Data

Mar. 16, 2018 (JP) ................................. 2018-049746

(51) Int. Cl.

| G11C 16/26 | (2006.01) |
|---|---|
| G11C 16/14 | (2006.01) |
| G11C 8/14 | (2006.01) |
| G11C 7/18 | (2006.01) |
| H01L 27/1157 | (2017.01) |
| G11C 16/08 | (2006.01) |
| G11C 16/04 | (2006.01) |

(52) U.S. Cl.
CPC ................ *G11C 16/14* (2013.01); *G11C 7/18* (2013.01); *G11C 8/14* (2013.01); *G11C 16/0483* (2013.01); *G11C 16/08* (2013.01); *G11C 16/26* (2013.01); *H01L 27/1157* (2013.01)

(58) Field of Classification Search
CPC .............................. G11C 1/0069; G11C 16/10
USPC ............................................ 365/218, 185.24
See application file for complete search history.

(56) References Cited

U.S. PATENT DOCUMENTS

| 5,440,509 | A | * | 8/1995 | Momodomi | ....... | G11C 16/0483 |
|---|---|---|---|---|---|---|
| | | | | | | 257/E27.103 |
| 5,796,657 | A | * | 8/1998 | Lee | ....... | H01L 27/115 |
| | | | | | | 257/E27.103 |
| 6,343,352 | B1 | * | 1/2002 | Davis | ....... | G06F 13/1626 |
| | | | | | | 365/194 |
| 6,512,694 | B2 | * | 1/2003 | Herdt | ....... | G11C 16/0483 |
| | | | | | | 365/185.17 |
| 6,862,223 | B1 | * | 3/2005 | Lee | ....... | H01L 27/11524 |
| | | | | | | 257/E27.103 |
| 10,318,250 | B1 | * | 6/2019 | Ferrie | ....... | G06F 11/3612 |
| 2002/0131302 | A1 | * | 9/2002 | Herdt | ....... | G11C 16/0483 |
| | | | | | | 365/185.17 |
| 2003/0214842 | A1 | * | 11/2003 | Jeong | ....... | G11C 8/08 |
| | | | | | | 365/185.17 |

(Continued)

FOREIGN PATENT DOCUMENTS

JP   2017-41287   2/2017

*Primary Examiner* — Michael T Tran

(74) *Attorney, Agent, or Firm* — Oblon, McClelland, Maier & Neustadt, L.L.P.

(57) ABSTRACT

According to one embodiment, a semiconductor memory device includes: a first memory unit including first and second memory cells; a second memory unit including third and fourth memory cells; a third memory unit including fifth and sixth memory cells; a first word line coupled to gates of the first, third, and fifth memory cells; and a second word line coupled to gates of the second, fourth, and sixth memory cells. In a write operation, the first memory cell, the third memory cell, the fifth memory cell, the sixth memory cell, the fourth memory cell, and the second memory cell are written in this order.

18 Claims, 11 Drawing Sheets

(56) References Cited

U.S. PATENT DOCUMENTS

| | | | |
|---|---|---|---|
| 2007/0058432 A1* | 3/2007 | Hosono | G11C 11/5628 365/185.11 |
| 2007/0133286 A1* | 6/2007 | Walker | G11C 16/10 365/185.17 |
| 2008/0071781 A1* | 3/2008 | Ninan | G06F 16/90344 |
| 2008/0106937 A1* | 5/2008 | Magnavacca | G11C 11/5628 365/185.03 |
| 2009/0267128 A1 | 10/2009 | Maejima | |
| 2009/0268522 A1 | 10/2009 | Maejima | |
| 2009/0285027 A1* | 11/2009 | Lee | G11C 16/0483 365/185.17 |
| 2010/0074009 A1* | 3/2010 | Parker | G11C 11/5671 365/185.03 |
| 2010/0207195 A1 | 8/2010 | Fukuzumi et al. | |
| 2010/0322000 A1* | 12/2010 | Shim | G11C 11/5628 365/185.03 |
| 2011/0004819 A1* | 1/2011 | Hazard | G06F 17/2229 715/221 |
| 2011/0032757 A1* | 2/2011 | Dutta | G11C 11/5628 365/185.02 |
| 2011/0284946 A1 | 11/2011 | Kiyotoshi | |
| 2012/0140562 A1* | 6/2012 | Choe | H01L 27/1157 365/185.18 |
| 2013/0250689 A1* | 9/2013 | Lai | G11C 11/5628 365/185.17 |
| 2016/0071594 A1* | 3/2016 | Paudel | G11C 16/10 365/185.11 |
| 2016/0072292 A1* | 3/2016 | Rogers | H02J 3/46 307/62 |
| 2016/0117256 A1* | 4/2016 | Dor | G06F 12/1009 711/103 |
| 2017/0052737 A1 | 2/2017 | Tokiwa | |
| 2017/0125101 A1* | 5/2017 | Miao | G11C 16/10 |
| 2019/0074062 A1* | 3/2019 | Chen | G11C 16/0483 |

\* cited by examiner

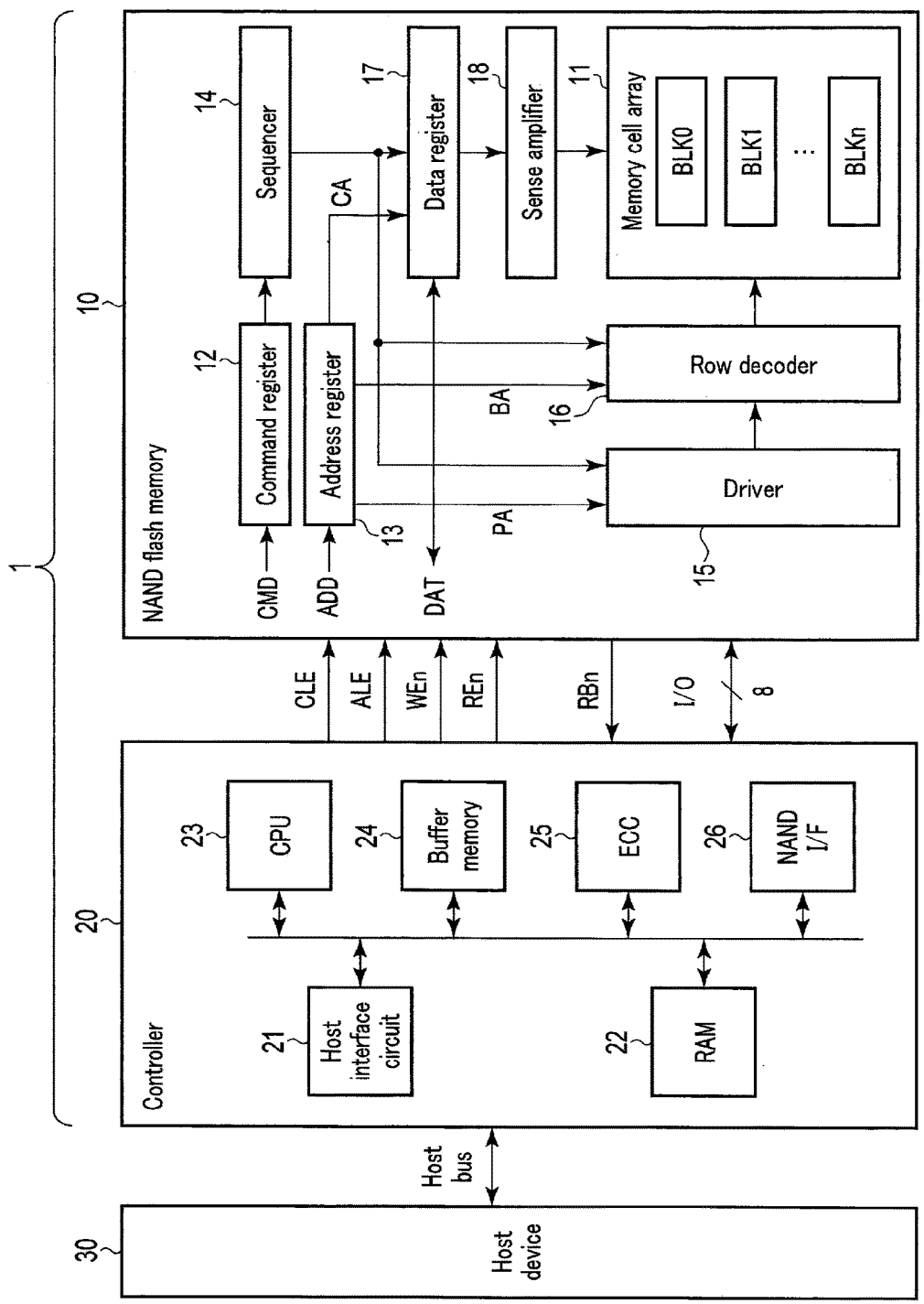
F I G. 1

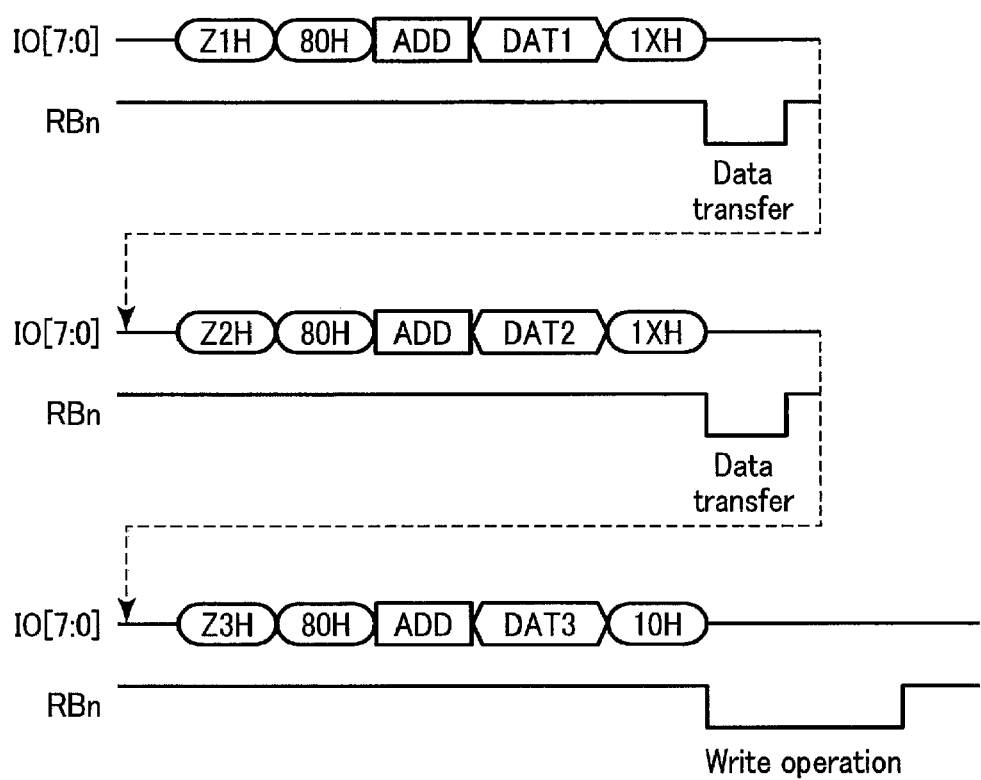
F I G. 4

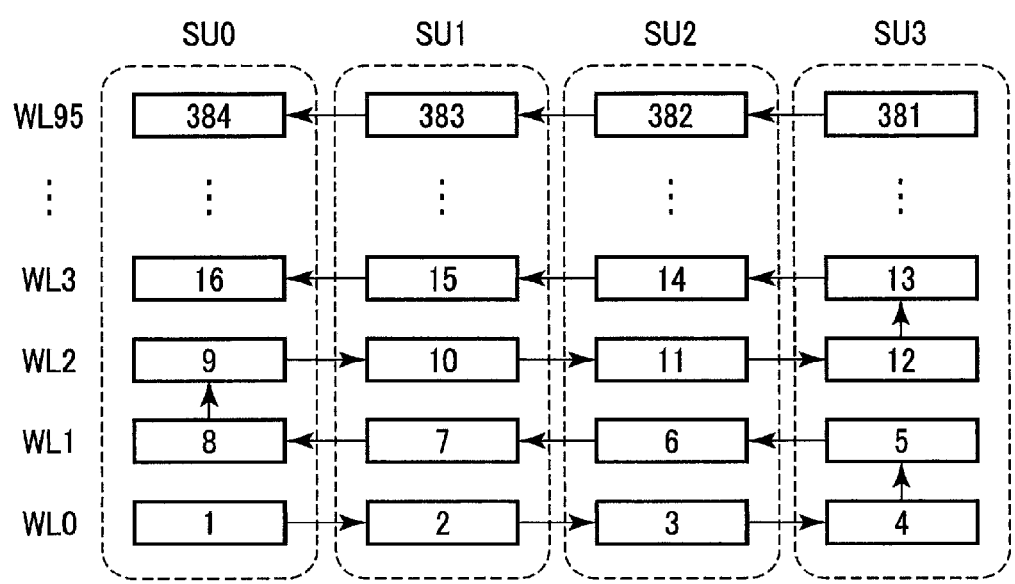
F I G. 6

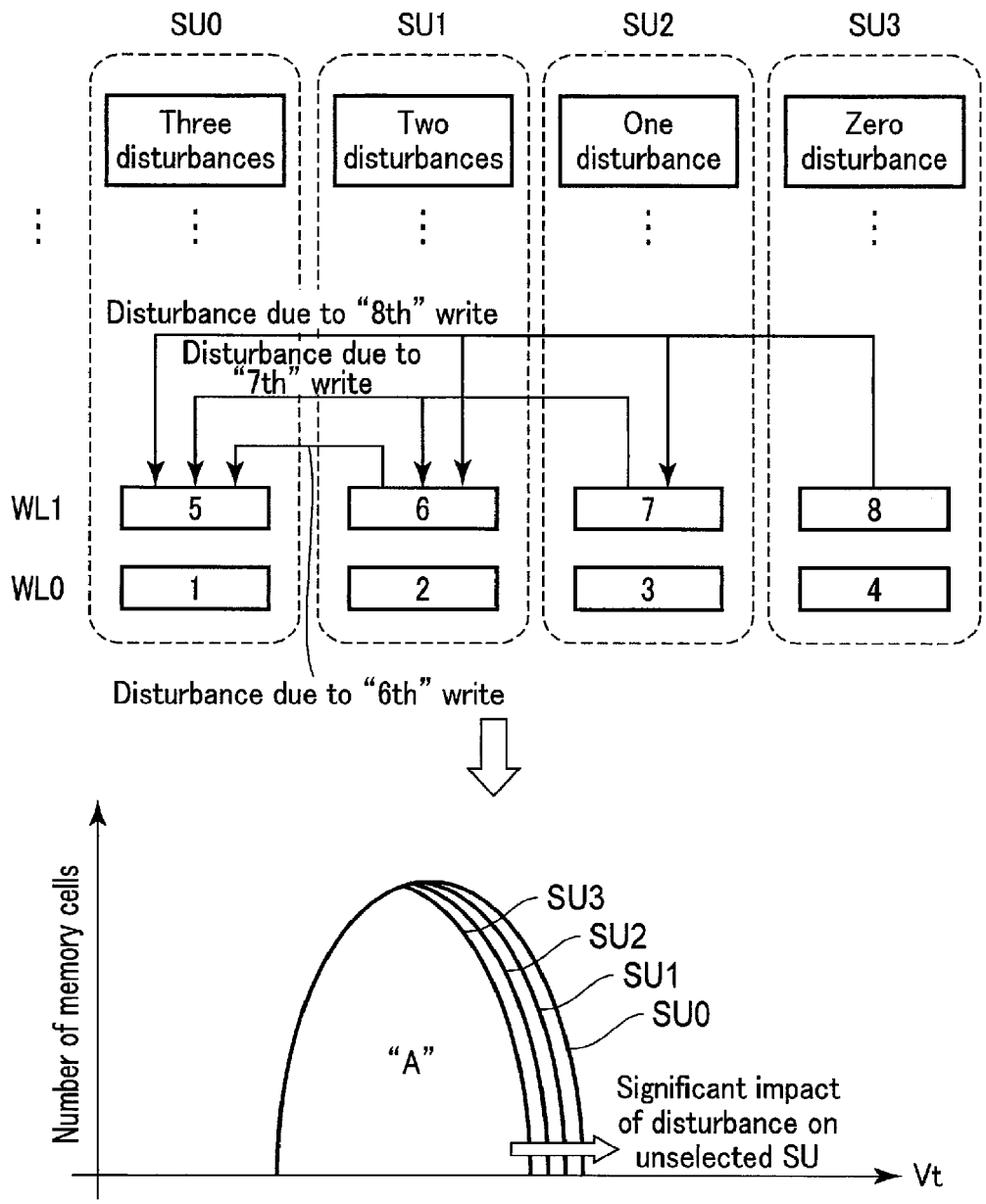
F I G. 8

|  | String selecting order | | | |
|---|---|---|---|---|
|  | 1 | 2 | 3 | 4 |
| WLi | SU0 | SU2 | SU3 | SU1 |
| WL(i+1) | SU1 | SU3 | SU0 | SU2 |
| WL(i+2) | SU2 | SU0 | SU1 | SU3 |
| WL(i+3) | SU3 | SU1 | SU2 | SU0 |

} Word line groups

F I G. 11

SEMICONDUCTOR MEMORY DEVICE AND MEMORY SYSTEM

CROSS-REFERENCE TO RELATED APPLICATIONS

This application is based upon and claims the benefit of priority from Japanese Patent Application No. 2018-049746, filed Mar. 16, 2018, the entire contents of which are incorporated herein by reference.

FIELD

Embodiments described herein relate generally to a semiconductor memory device and a memory system.

BACKGROUND

A NAND flash memory is known as a semiconductor memory device.

BRIEF DESCRIPTION OF THE DRAWINGS

FIG. 1 is a block diagram of a memory system according to the first embodiment;
FIG. 4 is a diagram illustrating a command sequence of a full-sequence write operation in the memory system according to the first embodiment;
FIG. 6 is a diagram illustrating a data writing order in the semiconductor memory device according to the first embodiment;
FIG. 8 is a diagram illustrating a data writing order and an "A" level threshold distribution in a comparative example;
FIG. 11 is a diagram illustrating a writing order with respect to a word line group in the semiconductor memory device according to the second embodiment.

DETAILED DESCRIPTION

Figure 2:
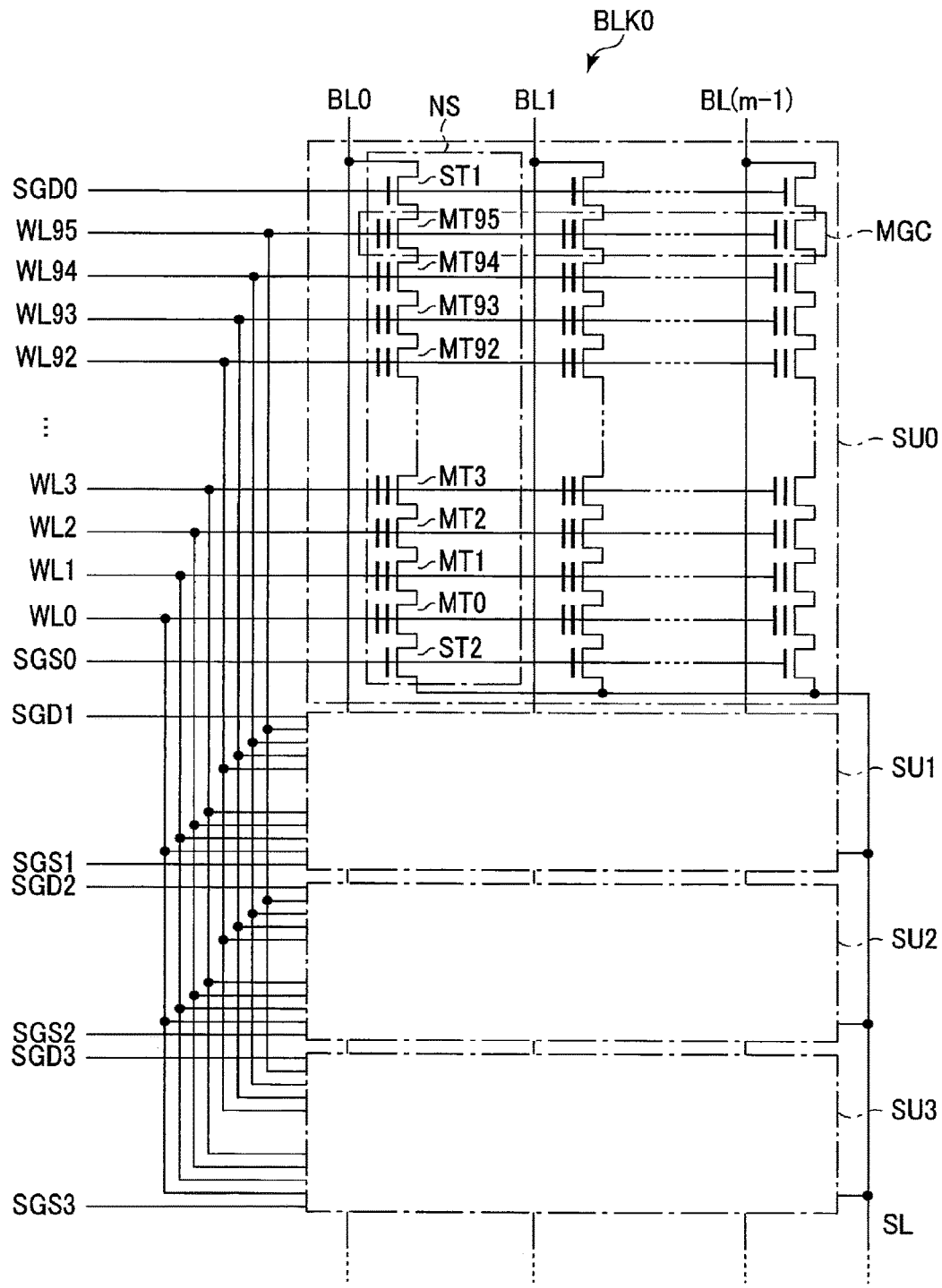
FIG. 2 is a circuit diagram of a memory cell array included in a semiconductor memory device according to the first embodiment.

In general, according to one embodiment, a semiconductor memory device includes: a first memory unit including a first memory string, the first memory string including first and second memory cells and a first select transistor; a second memory unit including a second memory string, the second memory string including third and fourth memory cells and a second select transistor; a third memory unit including a third memory string, the third memory string including fifth and sixth memory cells and a third select transistor; a first word line coupled to gates of the first, third, and fifth memory cells; a second word line coupled to gates of the second, fourth, and sixth memory cells; first to third select gate lines coupled to gates of the first to third select transistors, respectively; and a row decoder coupled to the first and second word lines and the first to third select gate lines. In a write operation, the first memory cell, the third memory cell, the fifth memory cell, the sixth memory cell, the fourth memory cell, and the second memory cell are written in this order.

1. First Embodiment

A semiconductor memory device and a memory system according to the first embodiment will be described. Hereinafter, a semiconductor memory device shall be described with reference to the example of a three-dimensional stacked NAND flash memory with memory cell transistors stacked on a semiconductor substrate.

1.1 Configuration
1.1.1 Configuration of Memory System
First, a general configuration of a memory system 1 will be described with reference to FIG. 1. In the example in FIG. 1, part of the coupling between blocks is indicated by directional lines. However, coupling between blocks is not limited to this.

As shown in FIG. 1, the memory system 1 comprises a semiconductor memory device 10 and a controller 20, and is coupled to an external host device 30. The controller 20 and the semiconductor memory device 10 may be combined to form a single semiconductor memory device, examples of which include a memory card such as SD™ card, an SSD (solid state drive), etc.

The controller 20 commands the semiconductor memory device 10 to execute read, write, and erase operations, etc., in response to a command from the host device 30. The controller 20 manages a memory space of the semiconductor memory device 10.

The controller 20 comprises a host interface circuit 21, a built-in memory (RAM) 22, a processor (CPU) 23, a buffer memory 24, an ECC circuit 25, and a NAND interface circuit 26.

The host interface circuit 21 is coupled to the host device 30 via a host bus, and controls communications with the host device 30. For example, the host interface circuit 21 transfers commands and data received from the host device 30, to the CPU 23 and the buffer memory 24, respectively. The host interface circuit 21 transfers data within the buffer memory 24 to the host device 30, in response to a command from the CPU 23.

The RAM 22 is, for example, a semiconductor memory such as DRAM, and holds a firmware for managing the semiconductor memory device 10, various types of management tables, etc. The RAM 22 is used as a working area of the CPU 23.

The CPU 23 controls the entire operation of the controller 20. For example, in response to a write command received from the host device 30, the CPU 23 issues a write command for the semiconductor memory device 10. The CPU 23 operates in a similar way in the case of receiving a read command and an erase command. The CPU 23 executes various types of processing such as ware leveling, etc., for managing a memory space of the semiconductor memory device 10.

The buffer memory 24 temporarily holds readout data which the controller 20 received from the semiconductor memory device 10, and write data which the controller 20 received from the host device 30, etc.

The ECC circuit 25 executes Error Checking and Correcting (ECC) processing. Specifically, during a data write operation, the ECC circuit 25 generates parity based on the write data. During a data read operation, the ECC circuit 25 generates a syndrome based on the parity to detect an error, thereby correcting the detected error.

The NAND interface circuit 26 is coupled to the semiconductor memory device 10 via a NAND bus, and controls communications with the semiconductor memory device 10. Signals to be transmitted and received between the semiconductor memory device 10 and the controller 20 follow the NAND interface. For example, the NAND interface circuit 26 transmits a command latch enable signal CLE, an address latch enable signal ALE, a write enable signal WEn, and a read enable signal REn to the semiconductor memory device 10, and receives a ready busy signal RBn from the semiconductor memory device 10, based on a command received from the CPU 23. Furthermore, an input/output signal I/O is transmitted and received between the NAND interface circuit 26 and the semiconductor memory device 10.

The signal I/O is, for example, an 8-bit signal, and includes a command CMD, address information ADD, data DAT, etc. For example, the input/output signal I/O transferred to the semiconductor memory device 10 during a write operation includes a write command CMD issued by the CPU 23, address information ADD, and write data DAT within the buffer memory 24. In addition, the input/output signal I/O transferred to the semiconductor memory device 10 during a read operation includes a readout command CMD and address information ADD, while the input/output signal I/O transferred to the controller 20 includes readout data DAT.

Signals CLE and ALE notify the semiconductor memory device 10 that the input signals I/O to the semiconductor memory device 10 are the command CMD and the address information ADD, respectively. A signal WEn is asserted at a Low ("L") level and causes the semiconductor memory device 10 to store the input signals I/O. A signal REn is asserted at the "L" level and reads the output signals I/O from the semiconductor memory device 10.

A ready/busy signal RBn notifies whether or not the semiconductor memory device 10 can receive commands from the controller 20. For example, the ready/busy signal RBn is set to a High ("H") level in a ready state in which the semiconductor memory device 10 can receive commands from the controller 20. The ready/busy signal. RBn is set to an "L" level in a busy state in which the semiconductor memory device 10 cannot receive such commands.

Examples of the host device 30 using the memory system 1 described above include, for example, a digital camera, a personal computer, etc.

Next, the configuration of the semiconductor memory device 10 will be described. The semiconductor memory device 10 includes a memory cell array 11, a command register 12, an address register 13, a sequencer 14, a driver 15, a row decoder 16, a data register 17, and a sense amplifier 18.

The memory cell array 11 includes a plurality of blocks BLK0 to BLKn (where "n" represents an integer of 1 or more). A block BLK is a set of nonvolatile memory cell transistors associated with bit lines and word lines, and is, for example, a unit of data erasure.

The command register 12 holds the command CMD received from the controller 20.

The address register 13 holds the address information ADD received from the controller 20. The address information ADD includes a column address CA, a page address PA, and a block address BA.

The sequencer 14 controls the operation of the entire semiconductor memory device 10 based on the command CMD held in the command register 12. Specifically, the sequencer 14 executes data write and read operations by controlling the driver 15, the row decoder 16, the data register 17, the sense amplifier 18, etc., based on the command CMD.

The driver 15 supplies a voltage generated by a voltage generating circuit (not shown) to the row decoder 16, based on the page address PA held in the address register 13.

The row decoder 16 selects one of the blocks BLK0 to BLKn based on a block address BA held in the address register 13. The row decoder 16 further selects a row direction in the selected block BLK and applies the voltage supplied by the voltage generating circuit, to a select word line.

The data register 17 includes a plurality of latch circuits. The latch circuits temporarily hold data. In a write operation, for example, the data register 17 temporarily holds write data received from the controller 20 via an input/output circuit (not shown), and transmits this data to the sense amplifier 18. In a read operation, for example, the data register 17 temporarily holds readout data received from the sense amplifier 18, and transmits this data to the controller 20 via the input/output circuit.

In the read operation, the sense amplifier 18 senses data read from the memory cell array 11. The sense amplifier 18 transmits the readout data to the data register 17. In the write operation, the sense amplifier 18 transmits write data to the memory cell array 11.

1.1.2 Configuration of Memory Cell Array

Here, a configuration of the memory cell array 11 will be explained with reference to FIG. 2. The example in FIG. 2 illustrates the block BLK0. However, the other blocks BLK have the same configurations.

As shown in FIG. 2, the block BLK0 includes, for example, four string units SU0 to SU3. Hereinafter, in cases not limited to string units SU0 to SU3, string units shall be expressed as either string unit SU, or string units SU. Each of the string units SU includes a plurality of NAND strings NS. Each of the NAND strings NS includes, for example, 96 memory cell transistors MT0 to MT95, and select transistors ST1 and ST2. In a three-dimensional stacked NAND flash memory, for example, the select transistor ST2, the memory cell transistors MT0 to MT95, and the select transistor ST1 of each NAND string NS are stacked in this order above a semiconductor substrate. Hereinafter, in cases not limited to the memory cell transistors MT0 to MT95, memory cell transistors shall be expressed as a memory cell transistor MT or memory cell transistors MT. Each of the memory cell transistors MT is provided with a control gate and a charge storage layer, and holds data in a nonvolatile manner.

The number of string units SU is not limited to 4. Moreover, the number of memory cell transistors MT is not limited to 96, and may be 8, 16, 32, 64, 128, etc., with no limitations. The number of select transistors ST1 and ST2 may be optional as long as one or more select transistors ST1 and one or more select transistors ST2 are provided. Each of the memory cell transistors MT may be of a MONOS type in which an insulating film is used as the charge storage layer or an FG type in which a conductive film is used as the charge storage layer.

The memory cell transistors MT are coupled in series between a source of the select transistor ST1 and a drain of the select transistor ST2. More specifically, the memory cell transistors MT0 to MT95 have their current paths coupled in series. The memory cell transistor MT95 has a drain coupled to a source of the select transistor ST1. The memory transistor MT0 has a source coupled to a drain of the select transistor ST2.

The select transistors ST1, which are included in the string units SU0 to SU3, respectively, are coupled to select gate lines SGD0 to SGD3, respectively. Similarly, the select transistors ST2, which are included in the string units SU0 to SU3, respectively, are coupled to select gate lines SGS0 to SGS3, respectively. Hereinafter, in cases not limited to the select gate lines SGD0 to SGD3, the select gate lines will be expressed as a select gate line SGD or select gate lines SGD. In cases not limited to the select gate lines SGS0 to SGS3, the select gate lines will be expressed as a select gate line SGS or select gate lines SGS. The select gate lines SGS0 to SGS3 of the respective string units SU may be coupled in common.

The memory cell transistors MT0 to MT95 in one block BLK have their control gates coupled to word lines WL0 to WL95, respectively. Hereinafter, in cases not limited to the word lines WL0 to WL95, the word lines will be expressed as a word line WL or word lines WL.

In one string unit SU, the select transistors ST1 of the NAND strings NS have their drains coupled to different bit lines BL0 to BL(m−1) (where "m" represents an integer of 2 or more), respectively. Hereinafter, in cases not limited to the bit lines BL0 to BL(m−1), the bit lines will be expressed as a bit line BL or bit lines BL. Each of the bit lines BL couples together the NAND strings NS, each of which is included in each of the string units SU in the plurality of blocks BLK. Further, sources of the select transistors ST2 are coupled together with the source line SL. In other words, each of the string units SU is an aggregate of the NAND strings NS coupled to the different bit lines BL, and also coupled to the same select gate lines SGD and SGS. Each of the blocks BLK is an aggregate of the plurality of the string units SU using the common word lines WL. The memory cell array 11 is an aggregate of the plurality of blocks BLK using the common bit lines BL.

Data write and read operations are performed on the memory cell transistors MT at once, the memory cell transistors MT which are being coupled to one of the word lines WL in one of the string units SU. A group of memory cell transistors MT selected at once in data write and read operations will be hereinafter referred to as a "memory cell group MCG". A set of 1-bit data written to, or read from, each of the memory cell transistors MT in one memory cell group MCG will be hereinafter referred to as a "page". Therefore, if 3-bit data is stored in one memory cell transistor MT, data corresponding to 3 pages is stored in the memory cell group MCG which is coupled to a single word line WL. Hereinafter, the present embodiment will be described with reference to the case where one memory cell transistor MT holds 3-bit data. In this case, 3-bit data is referred to as a lower bit, a middle bit, and an upper bit in advancing order from the lower bit. Regarding data held in the memory cell transistors MT coupled to the same word line WL, an aggregation of lower bits, an aggregation of middle bits, and an aggregation of upper bits are referred to as a "lower page", a "middle page", and an "upper page", respectively. Regarding data that the memory cell transistors MT can hold, the number of bits is not limited to 3. The present embodiment is applicable as long as the memory cell transistors MT can hold data of one or more bits. The number of bits held in the memory cell transistors MT0 to MT95 may differ for each memory cell transistor.

The memory cell array 11 may be configured in a different manner. The configuration of the memory cell array 11 is described, for example, in U.S. patent application Ser. No. 12/407,403 entitled "THREE DIMENSIONAL STACKED NONVOLATILE SEMICONDUCTOR MEMORY" filed on Mar. 19, 2009. The configuration of the memory cell array 11 is also described, for example, in U.S. patent application Ser. No. 12/406,524 entitled "THREE DIMENSIONAL STACKED NONVOLATILE SEMICONDUCTOR MEMORY" filed on Mar. 18, 2009, U.S. patent application Ser. No. 12/679,991 entitled "NON-VOLATILE SEMICONDUCTOR STORAGE DEVICE AND METHOD OF MANUFACTURING THE SAME" filed on Mar. 25, 2010, and U.S. patent application Ser. No. 12/532,030 entitled "SEMICONDUCTOR MEMORY AND METHOD FOR MANUFACTURING THE SAME" filed on Mar. 23, 2009. These patent applications are incorporated herein in entireties thereof by reference.

1.2 Threshold Distribution for Memory Cell Transistor

Here, a distribution of threshold voltages for a single memory cell transistor MT according to the present embodiment will be described with reference to FIG. 3.

Figure 3:
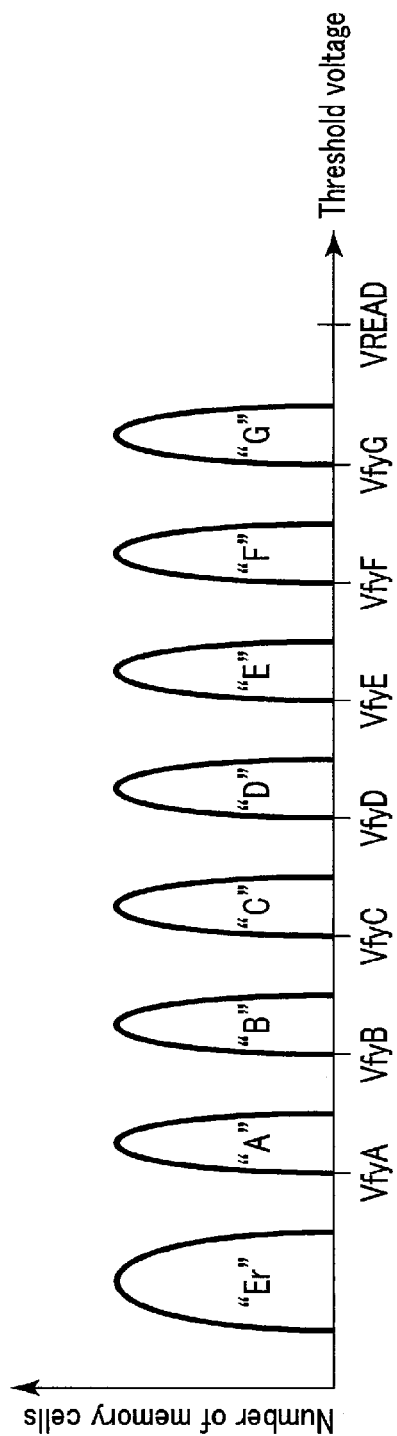
FIG. 3 is a threshold distribution diagram for memory cell transistors included in the semiconductor memory device according to the first embodiment.

As depicted in FIG. 3, a threshold voltage for each memory cell transistor MT takes a value included in one of, for example, eight discrete distributions. The eight distributions are hereinafter referred to as an "Er" level, an "A" level, a "B" level, a "C" level, a "D" level, an "E" level, an "F" level, and a "G" level in ascending order of threshold voltage.

The "Er" level correspond to, for example, a data erase state. Threshold voltages included in the "Er" level are smaller than a voltage VfyA and have positive or negative values.

The "A" to "G" levels correspond to a state where charge has been injected into the charge storage layer to write data. The threshold voltages included in each distribution have, for example, positive values. The threshold voltages included in the "A" level are equal to or higher than the voltage VfyA and are lower than a voltage VfyB (VfyB>VfyA). The threshold voltages included in the "B" level are equal to or higher than the voltage VfyB and are lower than a voltage VfyC (VfyC>VfyB). The threshold voltages included in the "C" level are equal to or higher than the voltage VfyC and are lower than a voltage VfyD (VfyD>VfyC). The threshold voltages included in the "D" level are equal to or higher than the voltage VfyD and are lower than a voltage VfyE (VfyE>VfyD). The threshold voltages included in the "E" level are equal to or higher than the voltage VfyE and are lower than a voltage VfyF (VfyF>VfyE). The threshold voltages included in the "F" level are equal to or higher than the voltage VfyF and are lower than a voltage VfyG (VfyG>VfyF). The threshold voltages included in the "G" level are equal to or higher than the voltage VfyG and are lower than a voltages VREAD (VREAD>VfyG). The voltage VREAD is applied to unselected word lines WL during a data read operation and sets the memory cell transistors MT to an on state regardless of their threshold voltages.

As described above, each memory cell transistor MT has one of the eight threshold distributions and can thus take eight states. These states are allocated to binary notation from "000" to "111" in order to allow each memory cell transistor MT to hold 3-bit data.

FIG. 3 has been described with reference to an example case where the eight levels are discretely distributed. However, this is an ideal state, for example, immediately after data write. In actuality, however, adjacent levels may overlap. For example, after data write, an upper end of the "Er" level and a lower end of the "A" level may overlap due to disturbance or such like. In such a case, data is corrected using, for example, the ECC technique, etc.

1.3 Write Operation

Now, a write operation will be described. A write operation generally includes a program operation and a verify operation. By repeating the combination of the program operation and verify operation (hereinafter referred to as a "program loop"), a threshold voltage of each memory cell transistor MT is raised to a target level.

The program operation refers to an operation of injecting electrons into the charge storage layer to increase the threshold voltage (or inhibiting the injection to maintain the threshold voltage). An operation of raising the threshold voltage is hereinafter referred to as a ""0" program", and the sense amplifier 18 gives a voltage (for example, a voltage VSS) corresponding to the "0" program to the target bit line BL for the "0" program. On the other hand, an operation of maintaining the threshold voltage is hereinafter referred to as a ""1" program" or "write inhibited", and the sense amplifier 18 gives a voltage (hereinafter expressed as a "voltage VBL") corresponding to the "1" program to the target bit line BL for the "1" program. The bit line corresponding to the "0" program is represented as BL("0"), and the bit line corresponding to the "1" program is represented as BL("1").

The verify operation is performed after the program operation to read data to determine whether or not the threshold voltage of the memory cell transistor MT has reached the intended target level. Hereinafter, the case where the threshold voltage of the memory cell transistor MT has reached a target level is described as: "verification has passed". On the other hand, the case where the threshold voltage of the memory cell transistor MT has not reached a target level is described as: "verification has failed".

In the present embodiment, 3-bit data is written at once to one memory cell transistor MT. That is, data corresponding to 3 pages comprising a lower page, a middle page, and an upper page is written to one memory cell group MCG at once. Hereinafter, such a write operation will be referred to as a "full-sequence write operation".

The number of pages to be written at once in a full-sequence write operation is not specifically limited because this number depends on the number of bits of data that can be held by the corresponding memory cell transistor MT. For example, when the memory cell transistor MT can hold 2-bit data, the data corresponding to 2 pages is written in a full-sequence write operation. When the memory cell transistor MT can hold 1-bit data, the data corresponding to 1 page is written in a full-sequence write operation.

In addition, a write operation is not limited to this full-sequence write operation. For example, the lower page, the middle page, and the upper page may be written separately, and the full-sequence write operation may be divided into two write operations: a rough write operation and a precise write operation.

1.3.1 Command Sequence

Here, a command sequence transmitted from the controller 20 to the semiconductor memory device will be described with reference to FIG. 4. FIG. 4 shows a command sequence in a full-sequence operation, in particular, the input/output signal I/O and the ready/busy signal RBn to be inputted into the semiconductor memory device 10 and the like. For example, the command CMD input to the semiconductor memory device 10, the address information ADD, and the data DAT are stored in the command register 12, the address register 13, and the data register 17, respectively.

As shown in FIG. 4, first, the controller 20 sequentially transmits commands "Z1H" and "80H" to the semiconductor memory device 10. The command "Z1H" provides notification that the data in the lower page is to be transmitted. The command "80H" provides notification that a write operation is to be performed.

Next, the controller 20 transmits the address information ADD, the data DAT1 of a lower page, and the command "1XH" in succession to the semiconductor memory device 10. The command "1XH" is a data transfer command indicative of a data linkage between the lower page, the middle page, and the upper page of the same memory cell group MCG. Upon receiving the command "1XH", the sequencer 14 sets the ready/busy signal RBn to the "L" level and transfers the data DAT1 stored in the data register 17 to the sense amplifier 18. When the transfer of the data DAT1 to the sense amplifier 18 is completed, the sequencer 14 sets the ready/busy signal RBn to the "H" level.

Upon receiving the ready/busy signal RBn at the "H" level, the controller 20 sequentially transmits the command "Z2H", the command "80H", the address information ADD, the data DAT2 in the middle page, and the command "1XH" to the semiconductor memory device 10. The command "ZH2" provides notification that the data in the middle page is to be transmitted. Upon receiving the command "1XH", the sequencer 14 sets the ready/busy signal RBn to the "L" level and transfers the data DAT2 stored in the data register 17 to the sense amplifier 18. When the transfer of the data DAT2 to the sense amplifier 18 is completed, the sequencer 14 sets the ready/busy signal RBn to the "H" level.

Next, upon receiving the ready/busy signal RBn at the "H" level, the controller 20 sequentially transmits the command "Z3H", the command "80H", the address information ADD, the data DAT3 in the upper page, and the command "10H" to the semiconductor memory device 10. The command "Z3H" provides notification that the data in the upper page is to be transmitted. The command "10H" indicates execution of a write operation. Upon receiving the command "10H", the sequencer 14 transfers the data DAT3 stored in the data register 17 to the sense amplifier 18, and thereafter executes the full-sequence write operation.

The order in which the controller 20 outputs the data to the semiconductor memory device 10 can be optionally set. For example, the controller 20 may output the data in the pages in an order of the upper page, the middle page, and the lower page.

1.3.2 Overall Flow of Write Operation

The overall flow of a write operation will be explained with reference to FIG. 5. To simplify explanations, hereinafter, a variable "i" will be used to express a number assigned to each word line WL, and a variable "j" will be used to express a number assigned to each string unit SU. Each of the variables "i" and "j" is held in a counter included in the controller 20, and is incremented under control of the controller 20.

Figure 5:
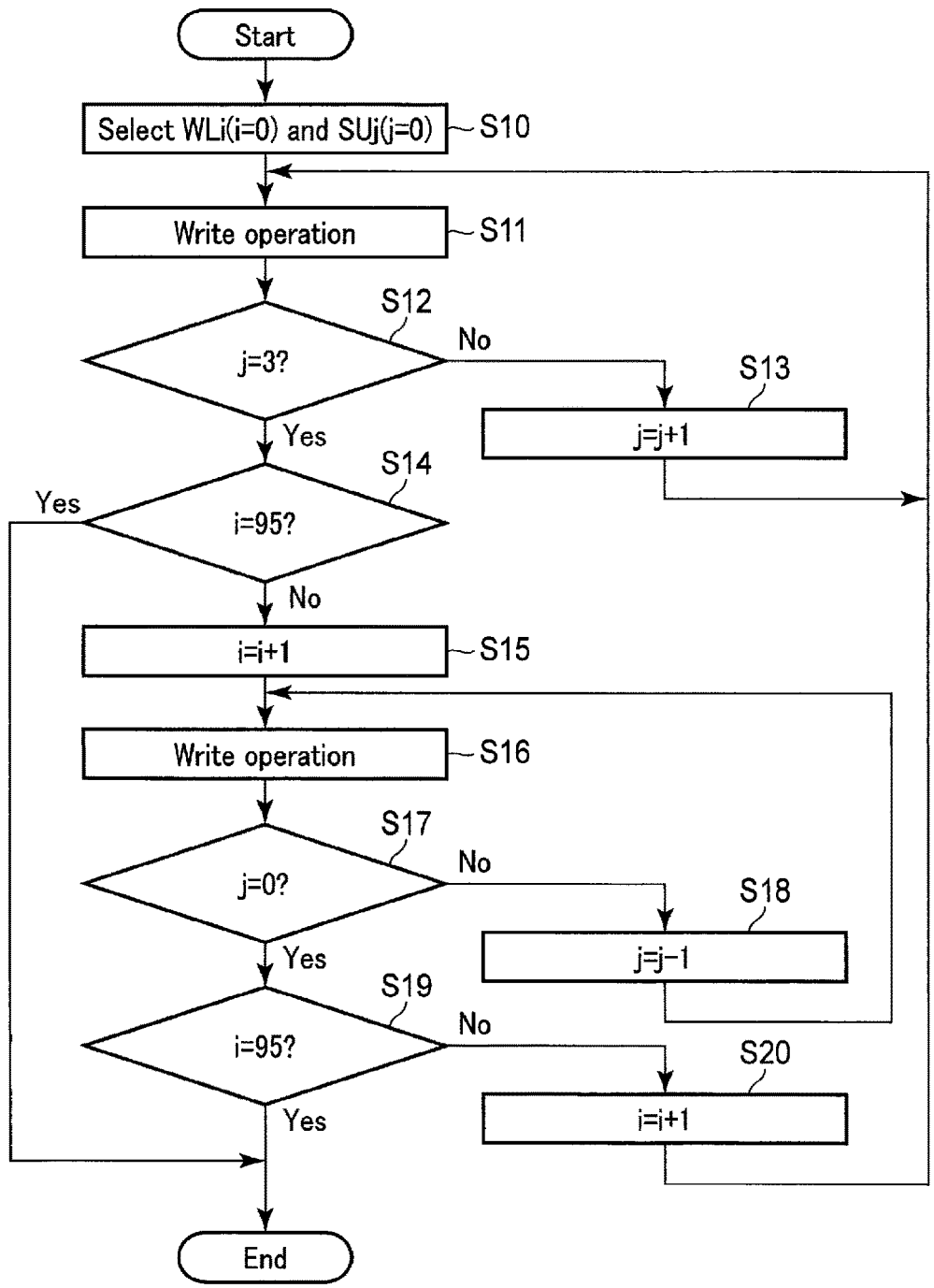
FIG. 5 is a flowchart illustrating a write operation in the memory system according to the first embodiment.

As shown in FIG. 5, first, the controller 20 selects i=j=0, that is, the word line WL0 and the string unit SU0 (step S10), and transmits a write command for the full-sequence write operation (the command CMD, the address information ADD, and the write data DAT) to the semiconductor memory device 10.

The sequencer 14 performs the full-sequence write operation in accordance with the write command received from the controller 20 (step S11).

Next, the controller 20 checks a number corresponding to the string unit SUj. If the variable "j" is not equal to 3 (step S12_No), that is, if the string unit SU3 is not selected, the controller 20 increments the variable "j" by one (step S13), thereby transmitting the subsequent write command to the semiconductor memory device 10. The processing returns to step S11, and the sequencer 14 performs the full-sequence write operation. In contrast, if the variable "j" is equal to 3 (step S12_Yes), that is, if the string unit SU3 is selected, the controller 20 checks a number corresponding to the word line WLi (step S14).

If the variable "i" is equal to 95 (step S14_Yes), that is, if the word line WL95 is selected, the controller 20 terminates the write operation in the corresponding block BLK. In contrast, if the variable "i" is not equal to (step S14_No), the controller 20 increments the variable "i" by one (step S15), thereby transmitting the subsequent write command to the semiconductor memory device 10. The sequencer 14 performs the full-sequence write operation in accordance with the write command as is the case in the step S11 (step S16).

Next, the controller 20 checks a number corresponding to the string unit SUj. If the variable "j" is not equal to 0 (step S17_No), that is, if the string unit SU0 is not selected, the controller decrements the variable "j" by one (step S18), thereby transmitting the subsequent write command to the semiconductor memory device 10. The processing returns to step S16, and the sequencer 14 performs the full-sequence write operation. In contrast, if the variable "j" is equal to 0 (step S17_Yes), that is, if the string unit SU0 is selected, the controller 20 checks a number corresponding to the word line WLi as is the case in step S14 (step S19).

If the variable "i" is not equal to 95 (step S19_No), the controller 20 increments the variable "i" by one, thereby transmitting the subsequent write command to the semiconductor memory device 10 (step S20). The processing returns to step S11, and the sequencer 14 performs the full-sequence write operation in accordance with the write command. In contrast, if the variable "i" is equal to 95 (step S19_Yes), that is, if the word line WL95 is selected, the controller 20 terminates the write operation in the corresponding block BLK.

1.3.3 Data Writing Order

Now, the data writing order will be described in detail with reference to FIG. 6. FIG. 6 schematically depicts a cross-sectional configuration of the string units SU in a certain block BLK. Each rectangle in each of the string units SU represents one memory cell group MCG corresponding to one word line WL. That is, one rectangle corresponds to one full-sequence write operation. Numbers in the rectangles in FIG. 6 are indicative of a data writing in the memory cell groups MCG (selecting order). FIG. 6 shows the example in which 96 word lines WL and four string units SU are provided, and a total of 384 memory cell groups MCG are present. That is, the writing order involves the first to the 384th.

As shown in FIG. 6, if an even-numbered word line WL (WL0, WL2, WL4, ...) is selected, the string units SU0, SU1, SU2, and SU3 are subsequently selected. If an odd-numbered word line WL (WL1, WL3, WL5, ...) is selected, the string units SU3, SU2, SU1, and SU0 are subsequently selected.

More specifically, for the first to fourth operations, the sequencer 14 first performs the full-sequence write operation in which the word line WL0 is selected and the string units SU0, SU1, SU2, and SU3 are sequentially selected.

Next, for the fifth to eighth operations, the sequencer 14 performs the full-sequence write operation in which the word line WL1 is selected and the string units SU3, SU2, SU1, and SU0 are sequentially selected.

Next, for the ninth to 12th operations, the sequencer 14 performs the full-sequence write operation in which the word line WL2 is selected and the string units SU0, SU1, SU2, and SU3 are sequentially selected.

Next, for the 13th to 16th operations, the sequencer 14 performs the full-sequence write operation in which the word line WL3 is selected and the string units SU3, SU2, SU1, and SU0 are sequentially selected.

The sequencer 14 repeatedly performs the full-sequence operations in a similar manner with respect to the subsequent word lines WL. Thereafter, for the 381st to 384th operations, the sequencer 14 performs the full-sequence write operation in which the word line WL95 is selected and the string units SU3, SU2, SU1, and SU0 are sequentially selected.

1.3.4 Voltages of Interconnects during Program Operation

Here, an example of the voltages of interconnects during the program operation will be described with reference to FIG. 7. The example in FIG. 7 shows the operation in one program loop.

Figure 7:
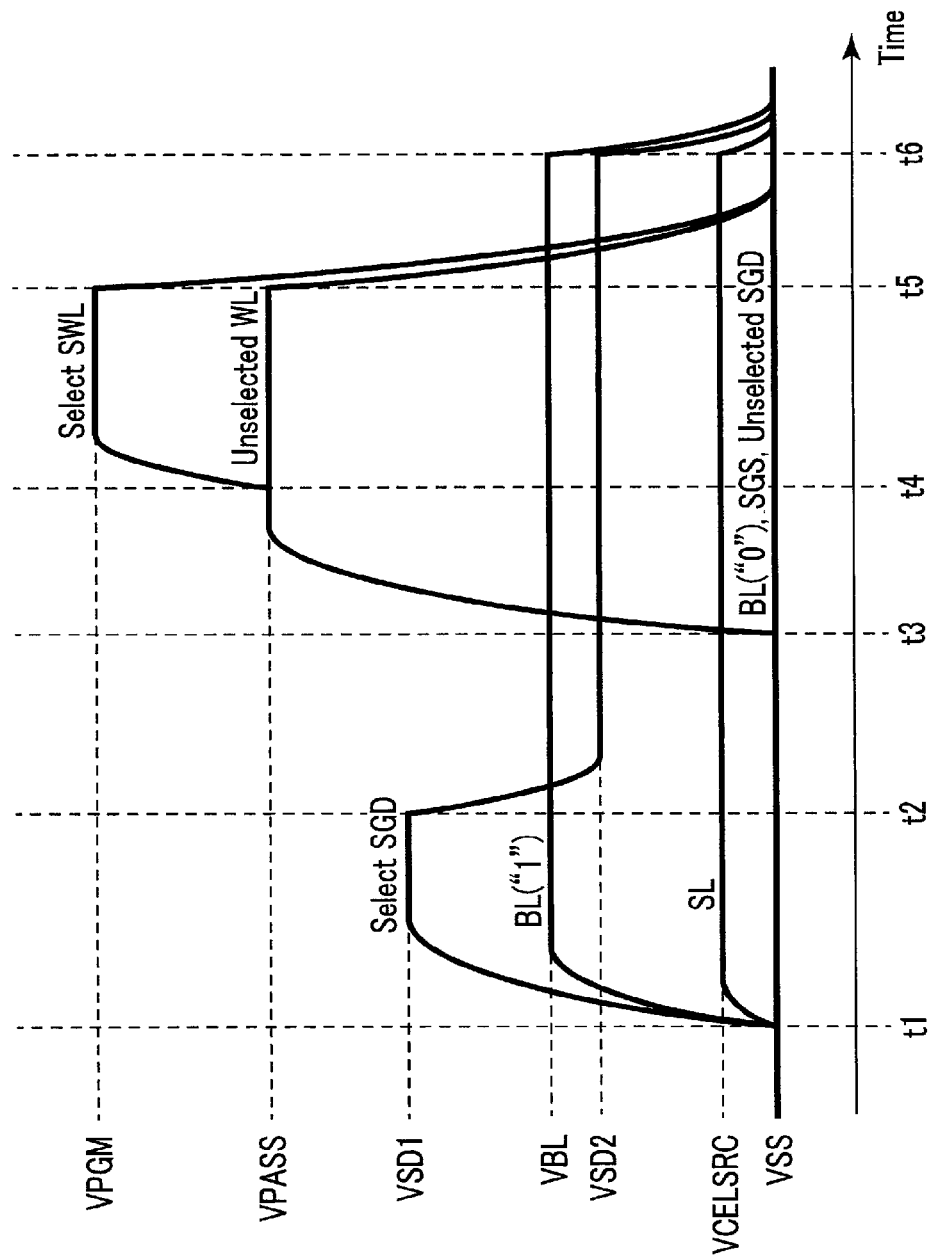
FIG. 7 is a timing chart illustrating voltages of interconnects during a program operation in the semiconductor memory device according to the first embodiment.

As shown in FIG. 7, at time t1, the sense amplifier 18 starts BL pre-charging by applying the voltage VBL to the bit line BL ("1"). The row decoder 16 applies a voltage VSD1 to the select gate line SGD ("select SGD") of the selected string unit SU in the selected block BLK. The voltage VSD1 is a voltage for setting the select transistor ST1 to an on state. On the contrary, the row decoder 16 applies the voltage VSS to the select gate line SGD ("unselected SGD") of the unselected string unit SU, thereby setting the corresponding select transistor ST1 to an off state. The row decoder 16 sets the select transistor ST2 to an off state by applying the voltage VSS to the select gate lines SGS of the selected string unit SU and the unselected string unit SU. Furthermore, the voltage VCELSRC (>VSS) is applied to the source line SL. Therefore, the unselected string unit SU enters a floating state since the select transistors ST1 and ST2 are in the off state.

At time t2, the row decoder 16 applies a voltage VSD2 to the select gate line SGD of the selected string unit SU. The voltage VSD2 is lower than the voltages VSD1 and VBL, and sets the select transistor ST1 to which the voltage VSS is applied to an on state, while also setting the select transistor ST1 to which the voltage VBL is applied to a cutoff state. This takes a channel of the NAND string NS corresponding to the bit line BL ("1") into a floating state.

At time t3, the row decoder 16 applies a voltage VPASS to the respective word lines WL of the selected string unit SU. The voltage VPASS sets the memory cell transistors MT to an on state regardless of their threshold voltages.

At time t4, the row decoder 16 applies a voltage VPGM to the selected word line WL of the selected string unit SU. The voltage VPGM is a high voltage for injecting electrons into the charge storage layer.

In the NAND string NS corresponding to the bit line BL ("0"), the select transistor ST1 is set to an on state. Thus, a channel potential of the memory cell transistor MT coupled to the selected word line WL takes VSS. This increases the difference in potential (VPGM-VSS) between the control gate and the channel. As a result, electrons are injected into the charge storage layer, thereby increasing the threshold voltage for the memory cell transistor MT corresponding to the bit line BL ("0").

In the NAND string NS corresponding to the bit line BL ("1"), the select transistor ST1 is set to a cutoff state. Thus, a channel voltage of the memory cell transistor MT coupled to the selected word line WL is made to electrically float. This increases a channel potential due to capacitive coupling with the word line WL and such like. Accordingly, the difference in potential between the control gate and the channel becomes smaller as compared to the memory cell transistor MT, which corresponds to the bit line BL ("0"). As a result, hardly any electrons are injected into the charge storage layer, thereby maintaining the threshold voltage for the memory cell transistor MT corresponding to the bit line BL ("1") (the threshold does not vary sufficiently to cause the threshold distribution level to transition to a higher distribution level).

At time t5, the row decoder 16 applies a voltage VSS to the word line WL.

At time t6, recovery processing is performed and a program operation is completed.

1.4 Effects of Present Embodiment

The configuration according to the present embodiment improves the reliability of the semiconductor memory device. This effect will be described below.

In the write operation, for example, in the unselected string unit SU in the selected block BLK, the select transistors ST1 and ST2 are set to an off state while the channel of the NAND string NS is set to a floating state. When the voltage VPASS or VPGM is applied to the word line WL in this condition, the channel potential is increased by capacitive coupling. At this time, the variation in channel potential is caused in accordance with data (threshold voltage) in the memory cell transistors MT having data written therein. An inter-band tunnel current is prone to occur between adjacent transistors with a large potential difference. Then, hot carriers are injected into the charge storage layer, thereby causing the phenomenon of an increase in the threshold voltage of the memory cell transistor MT (hereinafter, referred to as "disturbance"). Therefore, in the unselected string unit SU, one memory cell transistor MT in which data has been already written receives a disturbance due to a write operation in which any other string unit SU is selected.

Figure 9:
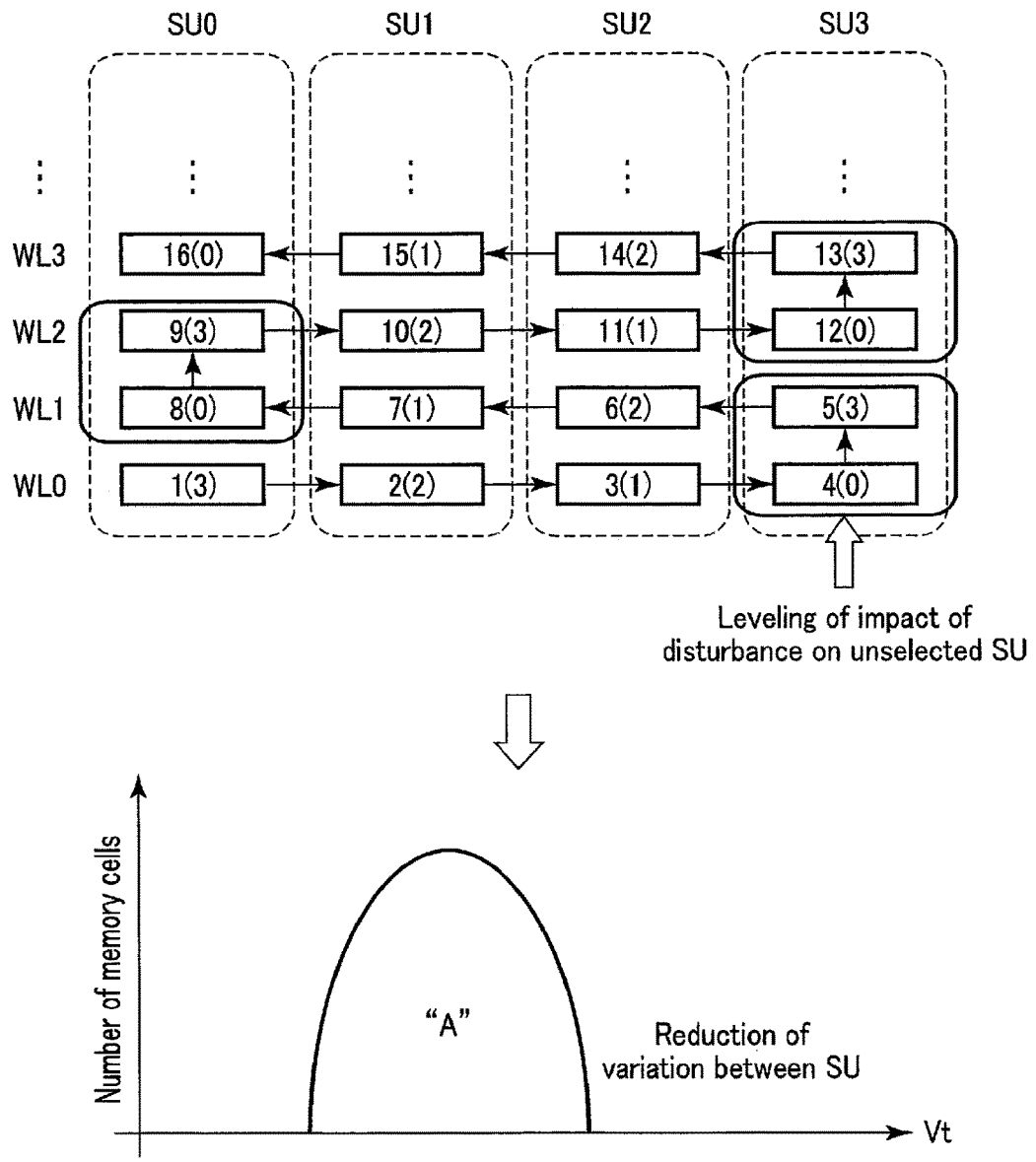
FIG. 9 is a diagram illustrating the data writing order and the "A" level threshold distribution in the semiconductor memory device according to the first embodiment.

The relationship between a data writing order and disturbances received by the unselected string units SU will be described with reference to FIGS. 8 and 9. FIG. 8 illustrates the data writing order and the threshold distribution of the "A" level when a write operation is performed by selecting the string units SU0, SU1, SU2, and SU3 in this order, regardless of the word line WL. FIG. 9 illustrates the data writing order and the threshold distribution of the "A" level according to the present embodiment.

As shown in FIG. 8, for example, the memory cell group MCG is the memory cell group into which data is written during the fifth write under the condition where the word line WL1 and the string unit SU0 are selected. This memory cell group MCG receives three disturbances due to the write operation, i.e., the sixth to eighth writes, with respect to any other string unit SU under the condition where the same word line WL is selected. Similarly, the memory cell group MCG of the string unit SU1, into which data is written during the sixth write, receives two disturbances due to the seventh and eighth writes. The memory cell group MCG of the string unit SU2, into which data is written during the seventh write, receives one disturbance due to the eighth write. The memory cell group MCG of the string unit SU3, into which data is written during the eighth write, is subjected to the last write, thereby receiving no disturbance due to the write operation with respect to any other string unit SU, under the condition where the same word line WL is selected. Regardless of the word line WL, if the order of selecting the string units SU is the same, the number of received disturbances will differ for each of the string units SU.

Therefore, the threshold distribution diagram of the "A" level shows a tendency that a string unit SU exhibits a threshold distribution, an upper skirt of which is wider as the string unit SU receives more disturbances. That is, there is a tendency for an upper skirt of a threshold distribution to be widest in the string unit SU3, followed by the string units SU2, SU1, and SU0. As described above, when the variation in threshold distribution is caused between the string units SU, their optimal read voltages differ from each other. Thus, the number of fail bits differs for each of the string units SU. For example, if the fail bits are concentrated in the string unit SU0 to the extent that the fail bits are increased in numbers beyond those that can be relieved by ECC processing, data misreading results, and the reliability of data reading deteriorates.

In contrast, with the configuration according to the present embodiment, if an even-numbered word line WL (WL0, WL2, WL4, . . . ) is selected, the string units SU0, SU1, SU2, and SU3 are subsequently selected. If an odd-numbered word line WL (WL1, WL3, WL5, . . . ) is selected, the string units SU3, SU2, SU1, and SU0 are subsequently selected. This enables the leveling of the number of disturbances received from any other string unit SU. The specific example is shown in FIG. 9. FIG. 9 shows the schematic diagram showing the writing order, in which the rectangular frames indicate the memory cell groups MCG. These rectangular frames contain the numbers in parentheses, which indicate the number of disturbances received during the write operation with respect to any other string unit SU.

As shown in FIG. 9, when the word lines WL1 and WL2 are focused on, in the string unit SU0, the memory cell group MCG subjected to the first write receives three disturbances, and the memory cell group MCG subjected to the eighth write receives no disturbances. Therefore, when viewing these two memory cell groups MCG together, the string unit SU0 receives three disturbances in total. Similarly, each of the other string units SU receives three disturbances in total. In this way described above, this enables for leveling of the impact of disturbance on the respective string units SU.

Furthermore, the memory cell group MCG coupled to the word line WLi may receive the impact of disturbance due to the operation of writing data into the memory cell group MCG coupled to the word line WL(i+1).

In contrast, with the configuration according to the present embodiment, the same string unit SU includes the memory cell group MCG which receives no disturbances due to the write operation with the word line WLi being selected, and the memory cell group MCG which receives three disturbances due to the write operation with the word line WL(i+1) being selected. That is, after the completion of the write operation in which the word line WLi is selected, the write operation in which the word line WL(i+1) is selected is initiated under the condition where the same string unit SU is selected. More specifically, in the string unit SU3, for example, the fourth write in which the word line WL0 is selected, and the fifth write in which the word line WL1 is selected, are performed. This enables the leveling of the impact of disturbance on the memory cell group MCG coupled to the word line WLi, caused by the write operation to the word line WL(i+1).

For example, in the string unit SU3, the memory cell group MCG subjected to the fourth write receives no disturbance due to the write operation to other memory cell groups MCG coupled to the same word line WL0, but receives three disturbances from other memory cell groups MCG coupled to the adjacent word line WL1, as the memory cell group MCG subjected to the fifth write receives three disturbances. Therefore, the memory cell group MCG subjected to the fourth write receives three disturbances in total, due to the write operation made to other memory cell groups MCG being coupled to the same word line WLi, and the write operation made to other memory cell groups MCG of another string unit SU being coupled to the adjacent word line WL(i+1). Similarly, the memory cell group MCG of another string unit SU receives a total of three disturbances due to the write operation being made to other memory cell group MCG coupled to the same word line WL, and the write operation made to other memory cell groups MCG of another string unit SU being coupled to the adjacent word line WL.

As described above, it is possible to level the total number of disturbances that one memory cell group MCG receives due to the write operation made to other memory cell groups MCG being coupled to the same word line WL, and due to the write operation made to other memory cell groups MCG of another string unit SU being coupled to the adjacent word line WL. That is, the impact of disturbance can be leveled. This reduces the variation in the upper skirt of a threshold distribution between the string units SU, as shown in FIG. 9.

Accordingly, the number of fail bits can be leveled between the respective string units SU. This prevents data misreading, thereby improving the reliability of the semiconductor memory device.

2. Second Embodiment

The second embodiment will be explained below. The data writing order explained in the second embodiment differs from that of the first embodiment. Hereinafter, only the matters which differ from the first embodiment will be described.

2.1 Data Writing Order

Now, the data writing order will be described in detail with reference to FIG. 10.

Figure 10:
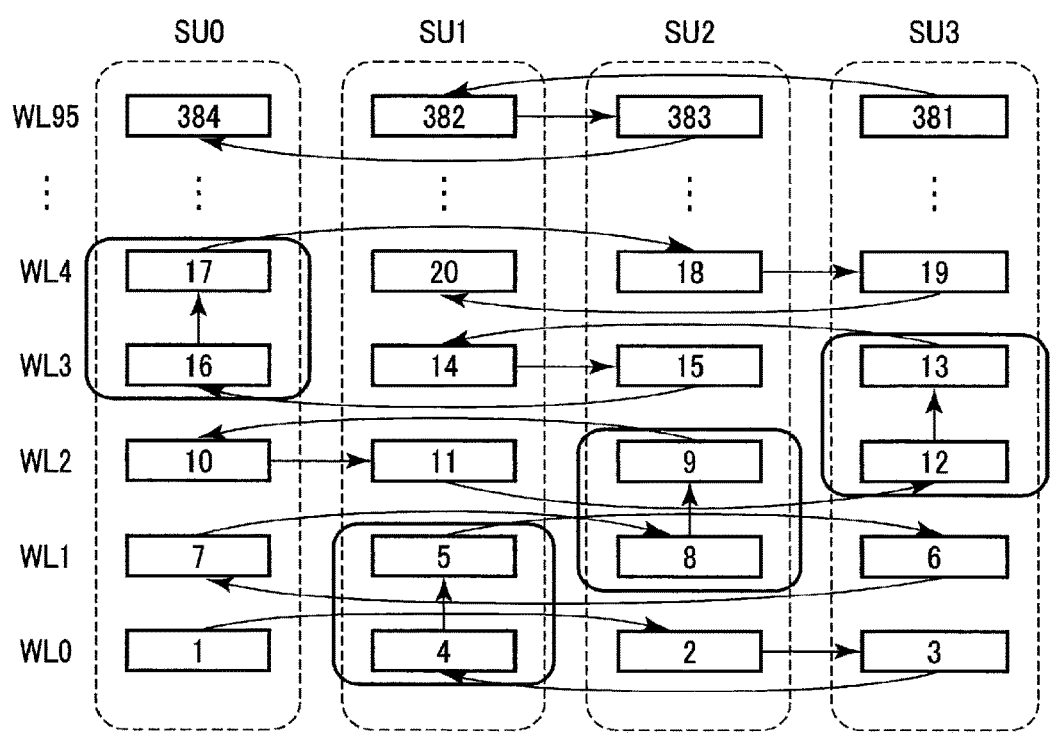
FIG. 10 is a diagram illustrating a data writing order in the semiconductor memory device according to the second embodiment.

In the present embodiment, as shown in FIG. 10, the write operation made by selection of each of the word lines WL causes a shifting of the string unit SU, which is selected first.

More specifically, for the first to fourth operations, first, the sequencer 14 performs the full-sequence write operation in which the word line WL0 is selected and the string units SU0, SU2, SU3, and SU1 are sequentially selected.

Next, for the fifth to eighth operations, the sequencer 14 performs the full-sequence write operation in which the word line WL1 is selected and the string units SU1, SU3, SU0, and SU2 are sequentially selected. Therefore, the string unit SU to be selected first is shifted from the string unit SU0 to the string unit SU1.

Next, for the ninth to 12th operations, the sequencer 14 performs the full-sequence write operation in which the word line WL2 is selected and the string units SU2, SU0, SU1, and SU3 are sequentially selected. Therefore, the string unit SU to be selected first is shifted from the string unit SU1 to the string unit SU2.

Next, for the 13th to 16th operations, the sequencer 14 performs the full-sequence write operation in which the word line WL3 is selected and the string units SU3, SU1, SU2, and SU0 are sequentially selected. Therefore, the string unit SU to be selected first is shifted from the string unit SU2 to the string unit SU3.

Next, for the 17th to 20th operations, the sequencer 14 performs the full-sequence write operation in which the word line WL4 is selected and the string units SU0, SU2, SU3, and SU1 are sequentially selected. Therefore, the string unit SU to be selected first is shifted from the string unit SU3 to the string unit SU0.

The sequencer 14 repeatedly performs the full-sequence operation in a similar manner with respect to the subsequent word lines WL. Then, as the 381st to 384th operations, the sequencer 14 performs the full-sequence write operation in which the word line WL95 is selected and the string units SU1, SU2, SU0, and SU3 are sequentially selected.

Specifically, from the word line WL0 to the word line WL95, the sequencer 14 repeatedly shifts the string unit SU subjected to the first write among the string units SU0, SU1, SU2, and SU3 in this order. Accordingly, the four word lines WL corresponding to the four string units SU are considered as a single word line group. The cycle of selecting one string unit SU is repeated for each word line group. More specifically, for example, the word lines WL0 to WL3 are included in a single word line group. The subsequent word lines WL are grouped in a similar manner.

Next, the order of the write operation in a single word line group will be described with reference to FIG. 11.

As shown in FIG. 11, a single word line group includes the word lines WLi to WL(i+3). In the case of the word line WLi, the write operation is performed to the string units SU0, SU2, SU3, and SU1 in this order. In the case of the word line WL(i+1), the string unit SU to be selected first is shifted from the string unit SU0 to the string unit SU1, and the write operation is performed to the string units SU1, SU3, SU0, and SU2 in this order. In the case of the word line WL(i+2), the string unit SU to be selected first is shifted from the string unit SU1 to the string unit SU2, and the write operation is performed to the string units SU2, SU0, SU1, and SU3 in this order. In the case of the word line WL(i+3), the string unit SU to be selected first is shifted from the string unit SU2 to the string unit SU3, and the write operation is performed to the string units SU3, SU1, SU2, and SU0 in this order.

2.2 Effects of Present Embodiment

The configuration of the present embodiment achieves advantageous effects similar to those achieved by the first embodiment.

3. Modification, Etc.

The semiconductor memory device according to the above embodiments comprises: a first memory unit (SU1) including a first memory string (NS), the first memory string (NS) including first and second memory cells (MT0, MT1) and a first select transistor (ST1); a second memory unit (SU2) including a second memory string (NS), the second memory string (NS) including third and fourth memory cells (MT0, MT1) and a second select transistor (ST1); a third memory unit (SU3) including a third memory string (NS), the third memory string (NS) including fifth and sixth memory cells (MT0, MT1) and a third select transistor (ST1); a first word line (WL0) coupled to gates of the first memory cell (MT0), the third memory cell (MT0), and the fifth memory cell (MT0); a second word line (WL1) coupled to gates of the second memory cell (MT1), the fourth memory cell (MT1), and the sixth memory cell (MT1); first to third select gate lines (SGD1 to SGD3) coupled to gates of the first to third select transistors, respectively; and a row decoder (16) coupled to the first and second word lines and the first to third select gate lines. In the write operation, the first memory cell, the third memory cell, the fifth memory cell, the sixth memory cell, the fourth memory cell, and the second memory cell are written in this order.

Application of the above-described embodiments can provide a more reliable semiconductor memory device.

The embodiments are not limited to the configurations explained above and can be modified in various ways.

For example, the NAND flash memory in the above-described embodiments may be a planar NAND flash memory in which the memory cell transistors are arranged two-dimensionally above the semiconductor substrate.

In addition, the term "couple" in the above embodiments includes a state of indirect coupling via, for example, a transistor, a resistance or the like.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor memory device comprising:
   a first memory unit including a first memory string, the first memory string including first and second memory cells and a first select transistor;
   a second memory unit including a second memory string, the second memory string including third and fourth memory cells and a second select transistor;
   a third memory unit including a third memory string, the third memory string including fifth and sixth memory cells and a third select transistor;
   a first word line coupled to gates of the first, third, and fifth memory cells;
   a second word line coupled to gates of the second, fourth, and sixth memory cells;
   first to third select gate lines coupled to gates of the first to third select transistors, respectively; and
   a row decoder coupled to the first and second word lines and the first to third select gate lines,
   wherein, in a write operation, the first memory cell, the third memory cell, the fifth memory cell, the sixth memory cell, the fourth memory cell, and the second memory cell are written in this order.

2. The device according to claim 1, further comprising:
   a fourth memory unit including a fourth memory string, the fourth memory string including a seventh memory cell, a gate of which is coupled to the first word line, an eighth memory cell, a gate of which is coupled to the second word line, and a fourth select transistor; and
   a fourth select gate line that couples a gate of the fourth select transistor and the row decoder,
   wherein, in the write operation, the seventh memory cell and the first memory cell are written in this order, and the second memory cell and the eighth memory cell are written in this order.

3. The device according to claim 2, further comprising a third word line, wherein:
   the first memory unit further includes a ninth memory cell, a gate of which is coupled to the third word line;
   the second memory unit further includes a 10th memory cell, a gate of which is coupled to the third word line;
   the third memory unit further includes an 11th memory cell, a gate of which is coupled to the third word line;
   the fourth memory unit further includes a 12th memory cell, a gate of which is coupled to the third word line; and
   in the write operation, the eighth memory cell, the 12th memory cell, the ninth memory cell, the 10th memory cell, and the 11th memory cell are written in this order.

4. The device according to claim 1, wherein the first memory cell, the second memory cell, and the first select transistor are coupled in series.

5. The device according to claim 1, further comprising a bit line coupled to the first select transistor.

6. The device according to claim 1, which is a NAND flash memory.

7. The device according to claim 1, wherein in the write operation, when the first memory cell is written, the row decoder applies a first voltage to the first select gate line, a second voltage lower than the first voltage to the second and third select gate lines, a write voltage higher than the first voltage to the first word line, and a third voltage higher than the first voltage and lower than the write voltage to the second word line.

8. The device according to claim 7, wherein in the write operation, when the first memory cell is written, the first select transistor is set to an on state, and the second and third select transistors are set to an off state.

9. A semiconductor memory device comprising:
   a first memory unit including a first memory string, the first memory string including first to third memory cells and a first select transistor;
   a second memory unit including a second memory string, the second memory string including fourth to sixth memory cells and a second select transistor;
   a third memory unit including a third memory string, the third memory string including seventh to ninth memory cells and a third select transistor;
   a first word line coupled to gates of the first, fourth, and seventh memory cells;
   a second word line coupled to gates of the second, fifth, and eighth memory cells;
   a third word line coupled to gates of the third, sixth, and ninth memory cells;
   first to third select gate lines coupled to gates of the first to third select transistors, respectively; and
   a row decoder coupled to the first to third word lines and the first to third select gate lines, wherein:
   a write operation is executed;
   in the write operation in which the first word line is selected, the fourth memory cell is selected last;
   in the write operation in which the second word line is selected, the fifth memory cell is selected first and the eighth memory cell is selected last; and
   in the write operation in which the third word line is selected, the ninth memory cell is selected first and the sixth memory cell is selected last.

10. The device according to claim 9, wherein:
    in the write operation in which the first word line is selected, the first and seventh memory cells are selected and thereafter, the fourth memory cell is selected;

in the write operation in which the second word line is selected, the fifth memory cell is selected first and thereafter, the second memory cell and the eighth memory cell are selected in this order; and in the write operation in which the third word line is selected, the ninth memory cell is selected first and thereafter, the third memory cell and the sixth memory cell are selected in this order.

11. The device according to claim 10, further comprising:
a fourth memory unit including a fourth memory string, the fourth memory string including a 10th memory cell, a gate of which is coupled to the first word line, an 11th memory cell, a gate of which is coupled to the second word line, a 12th memory cell, a gate of which is coupled to the third word line, and a fourth select transistor; and
a fourth select gate line that couples a gate of the fourth select transistor and the row decoder, wherein:
in the write operation in which the first word line is selected, the seventh memory cell and the 10th memory cell are selected in this order and thereafter, the fourth memory cell is selected;
in the write operation in which the second word line is selected, the fifth memory cell and the 11th memory cell are selected in this order and thereafter, the second memory cell is selected; and
in the write operation in which the third word line is selected, the sixth memory cell and the 12th memory cell are selected in this order.

12. The device according to claim 9, wherein the first memory cell, the second memory cell, the third memory cell, and the first select transistor are coupled in series.

13. The device according to claim 9, further comprising a bit line coupled to the first select transistor.

14. The device according to claim 9, which is a NAND flash memory.

15. A memory system comprising:
a semiconductor memory device; and
a controller,
wherein the semiconductor memory device includes:
a first memory unit including a first memory string, the first memory string including first and second memory cells and a first select transistor;
a second memory unit including a second memory string, the second memory string including third and fourth memory cells and a second select transistor;
a third memory unit including a third memory string, the third memory string including fifth and sixth memory cells and a third select transistor;
a first word line coupled to gates of the first, third, and fifth memory cells;
a second word line coupled to gates of the second, fourth, and sixth memory cells;
first to third select gate lines coupled to gates of the first to third select transistors, respectively; and
a row decoder coupled to the first and second word lines and the first to third select gate lines, and
wherein, in a write operation in the semiconductor memory device, the controller commands the semiconductor memory device to write the first memory cell, the third memory cell, the fifth memory cell, the sixth memory cell, the fourth memory cell, and the second memory cell in this order.

16. The system according to claim 15, wherein:
the semiconductor memory device further includes:
a fourth memory unit including a fourth memory string, the fourth memory string including a seventh memory cell, a gate of which is coupled to the first word line, an eighth memory cell, a gate of which is coupled to the second word line, and a fourth select transistor; and
a fourth select gate line that couples a gate of the fourth select transistor and the row decoder; and
in the write operation, the controller commands the semiconductor memory device to write the seventh memory cell and the first memory cell in this order, and write the second memory cell and the eighth memory cell in this order.

17. The system according to claim 16, wherein:
the semiconductor memory device further includes a third word line;
the first memory unit further includes a ninth memory cell, a gate of which is coupled to the third word line;
the second memory unit further includes a 10th memory cell, a gate of which is coupled to the third word line;
the third memory unit further includes an 11th memory cell, a gate of which is coupled to the third word line;
the fourth memory unit further includes a 12th memory cell, a gate of which is coupled to the third word line; and
in the write operation, the controller commands the semiconductor memory device to write the eighth memory cell, the 12th memory cell, the ninth memory cell, the 10th memory cell, and the 11th memory cell in this order.

18. The system according to claim 15, wherein the semiconductor memory device is a NAND flash memory.

* * * * *